United States Patent
Amit et al.

(10) Patent No.: US 10,677,857 B2
(45) Date of Patent: Jun. 9, 2020

(54) THREE-AXIAL SENSOR INCLUDING SIX SINGLE-AXIS SENSORS

(71) Applicant: Biosense Webster (Israel) Ltd., Yokneam (IL)

(72) Inventors: Matityahu Amit, Cohav-Yair Zur-Yigal (IL); Eden Kidishman, Modiin (IL)

(73) Assignee: Biosense Webster (Israel) Ltd., Yokneam (IL)

( * ) Notice: Subject to any disclaimer, the term of this patent is extended or adjusted under 35 U.S.C. 154(b) by 0 days.

(21) Appl. No.: 15/843,837

(22) Filed: Dec. 15, 2017

(65) Prior Publication Data

US 2019/0187222 A1    Jun. 20, 2019

(51) Int. Cl.
   *G01R 33/02*    (2006.01)

(52) U.S. Cl.
   CPC ................ *G01R 33/0206* (2013.01)

(58) Field of Classification Search
   CPC ....... B03C 2201/26; B03C 1/02; B03C 1/288; H01F 38/14; H01F 2005/027; H01F 27/006; H01F 27/2823; H01F 27/325; H01F 38/12; H01F 41/086; H01F 41/096; H01F 5/00; H01F 5/02; H04B 5/0087; A61F 2002/7635; A61N 2/02; A61N 2/06; G01D 5/145; G01F 1/708; G01L 1/127; G01L 1/146; G01L 5/164; G05G 2009/04748; G05G 2009/04751; G01P 15/0888; G01P 15/105; G01P 15/11; G01P 15/18; G01P 1/023; G01R 33/0005; G01R 33/0206
   See application file for complete search history.

(56) References Cited

U.S. PATENT DOCUMENTS

| | | | | |
|---|---|---|---|---|
| 5,311,129 A | * | 5/1994 | Ludwig | A61B 5/06 324/247 |
| 6,169,470 B1 | | 1/2001 | Ibata et al. | |
| 8,818,486 B2 | * | 8/2014 | Montag | A61B 5/062 600/409 |
| 9,395,425 B2 | | 7/2016 | Diamond et al. | |
| 2002/0080002 A1 | * | 6/2002 | Oldfield | H01F 27/255 336/231 |

(Continued)

FOREIGN PATENT DOCUMENTS

| | | |
|---|---|---|
| CN | 102129049 A | 7/2011 |
| EP | 1067863 B1 | 12/2005 |
| EP | 2551691 A1 | 1/2013 |

(Continued)

OTHER PUBLICATIONS

Extended European Search Report dated May 28, 2019 for the European Patent Application No. 18212539.3.

*Primary Examiner* — Vinh P Nguyen
(74) *Attorney, Agent, or Firm* — Volpe and Koenig, P.C.

(57) ABSTRACT

A system and method for an improved magnetic sensor for use as a three three-axial sensor (TAS) is disclosed. The TAS provides an optimal sensor, concentric and the three coils are identical, with higher sensitivity resulting, a plurality of layers. More specifically, the sensor is made of multiple layers of printed circuit board (PCB). The multiple PCB layers are stacked according to various geometric shapes to create a sensor that enhances positional awareness. Concentric sensors may be arranged in a cube, stacked squares, or stacked squares decreasing in size to form a pyramid structure.

20 Claims, 6 Drawing Sheets

(56) References Cited

U.S. PATENT DOCUMENTS

2015/0219689 A1    8/2015  Liu et al.
2015/0357103 A1*  12/2015  Kim .......................... H01F 5/00
                                                               336/225

FOREIGN PATENT DOCUMENTS

| EP | 2752675 A1 | 7/2014 |
| EP | 3124989 A1 | 2/2017 |
| RU | 2503436 C1 | 1/2014 |
| SU | 600486 A1 | 3/1978 |
| WO | 2013006787 A1 | 10/2013 |
| WO | 2014/114401 A1 | 7/2014 |

* cited by examiner

THREE-AXIAL SENSOR INCLUDING SIX SINGLE-AXIS SENSORS

SUMMARY

To provide an accurate measurement of magnetic field by three-axial sensor (TAS) a sensitive sensor with known sensitivity is required. This sensor is used for example in surgical procedures where surgeons want to perform minimal invasive surgery with higher precision and accuracy. The use of magnetically navigated tools provide one mechanism to perform these types of surgery (e.g., Electro Physiology and Ear Nose Trots). An additional use of the sensor includes pilot helmet position tracking required to project targets in an accurate way on the helmet monocle.

The optimal TAS is concentric, symmetric and homogenic. That means, with similar sensitivity and resistance in the three axials (X, Y, Z). Other design considerations include manufacturing including both reputability and cost.

In designing the present TAS, the sensor is made of printed circuit board (PCB) improve the manufacturability comparing to traditional sensors that are built from a standard winded coil. The described PCB based TAS coil includes two important aspects: the TAS is built from six PCB pyramids that are attached together to form a cube; and each of the six PCB pyramids is built from several PCBs in a shape of "pyramid cuts" built from layers stacked according to various geometric shapes to create a sensor. The described sensor exhibits a high sensitivity density per volume as compared to other PCB technologies. The concentric sensors may be arranged in a cube, stacked squares, or stacked squares decreasing in size to form a pyramid structure that provides for construction of a cube.

A TAS device, system and method and a single-axis sensor (SAS) device, system and method are disclosed. The TAS includes six SASs, each SAS including a plurality of layers formed into a pyramid structure with each of the successive layers being configured to be smaller in area than the layer on which it is assembled, with each of the plurality of layers having formed thereon at least one coil, each of said at least one coil substantially encompassing the cross sectional area available within the layer that the coil is formed on, and a plurality of interconnections that interconnect each successive layer to its adjacent other layers, with the six SASs formed into a cube-like structure.

The SAS includes a plurality of layers formed into a pyramid structure with each of the successive layers being configured to be smaller in area than the layer on which it is assembled, with each of the plurality of layers having formed thereon at least one coil, each of said at least one coil substantially encompassing the cross sectional area available within the layer that the coil is formed on, and a plurality of interconnections that interconnect each successive layer to its adjacent other layers.

A method of forming a TAS is also disclosed. The method includes determining a number of layers to be included in each SAS as a pyramid of the three-axial sensor, manufacturing coils on each of the number of layers, with each successive layer decreasing in area footprint, interconnecting the coils within each of the layers, stacking the manufactured coils from largest to smallest to create a pyramid structure, interconnecting each successive layer to the adjacent other layers, and assembling six of the created SASs into a cube-like structure to form the TAS.

BRIEF DESCRIPTION OF THE DRAWINGS

A more detailed understanding may be had from the following description, given by way of example in conjunction with the accompanying drawings wherein.

DETAILED DESCRIPTION

Figure 1:
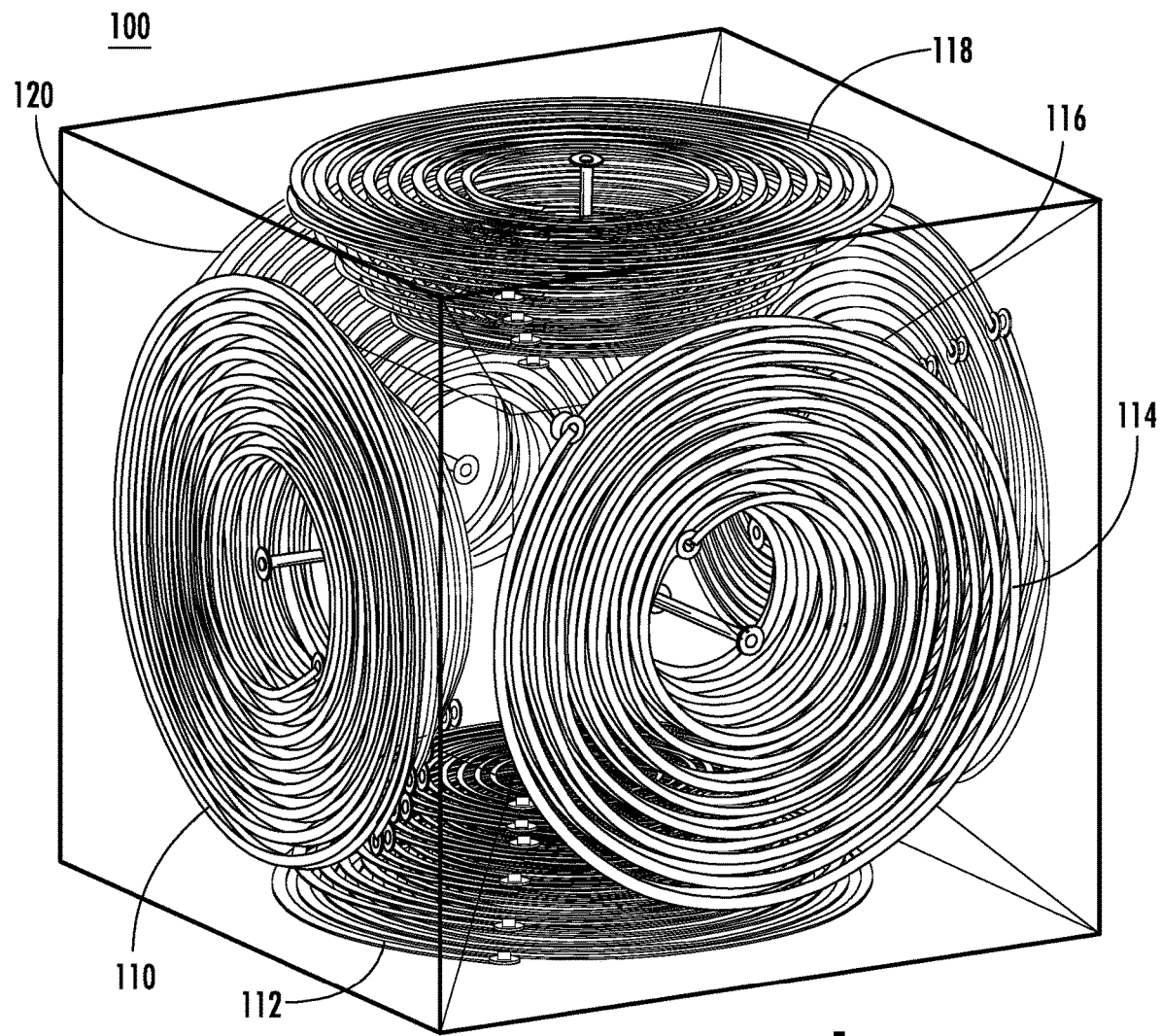
FIG. 1 illustrates a magnetic sensor formed as multi-layer sensor according to a first embodiment of the present invention.

In the following description, numerous specific details are set forth, such as particular structures, components, materials, dimensions, processing steps, and techniques, in order to provide a thorough understanding of the present embodiments. However, it will be appreciated by one of ordinary skill of the art that the embodiments may be practiced without these specific details. In other instances, well-known structures or processing steps have not been described in detail in order to avoid obscuring the embodiments. It will be understood that when an element such as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

In the interest of not obscuring the presentation of embodiments in the following detailed description, some structures, components, materials, dimensions, processing steps, and techniques that are known in the art may have been combined together for presentation and for illustration purposes and in some instances may have not been described in detail. In other instances, some structures, components, materials, dimensions, processing steps, and techniques that are known in the art may not be described at all. It should be understood that the following description is rather focused on the distinctive features or elements of various embodiments described herein.

A system and method for an improved magnetic sensor for use as a three three-axial sensor (TAS) is disclosed. The TAS provides high sensitivity by the use of PCB layers. The TAS sensors depicted are based on a coil. The receiving coil coverts the magnetic field to an analog signal that electronic equipment can detect, and in accordance with known parameters and algorithms, the position of the magnetic sensor is determined. The ability to covert the magnetic field into an analog voltage is defined as the sensitivity of the coil.

The sensitivity is directly proportional to the cross sectional area of the loops, also referred to as coils. This cross sectional area is confined within a given volume. By design, and in order to maintain a dynamic range of the system, each axis may be similar to one and other. The sensitivity of the sensor is a linear function of the surface area of loops created. Therefore, the present sensor maximizes the number of loops and the surface area of the loops in the defined volume to utilize the maximum area possible. As is known by those possessing an ordinary skill in the art, surface area is defined functionally as pi (Π) multiplied by the square of the radius of the loop. Therefore, by maintaining symmetry in each axis, the loops may provide the same sensitivity in each axis.

By way of example, the present TAS sensor may be used in any system where magnetic sensor sensing is utilized, including but not limited to, the known CARTO® Navigation System and the new ACCLARENT ENT navigation system.

The magnetic sensor may typically be made of several layers of printed circuit board (PCB); the PCB layers stacked in several layers according to various geometric shapes to create a magnetic sensor that enhances positional awareness. The resulting configuration provides increased sensitivity and greater accuracy. For example, the six-sided concentric and symmetric sensor increases sensing accuracy to make the positional findings more precise. The concentric sensor may be arranged in a cube, stacked squares, or stacked squares decreasing in size to form a pyramid structure. Ultimately, the pyramid structure may be combined to construct the cube. The cube shape provides sensitivity in all three axes that is approximately identical. As a result of the use of PCB technology and the general flat surface format of PCB technology, geometries such as the cube shape are easily formed.

FIG. 1 illustrates a magnetic sensor formed as multi-layer sensor 100. The multi-layer sensor 100 may be formed as a cube. Multi-layer sensor 100 may include six pyramids 110, 112, 114, 116, 118, 120 of loops, each comprising one side of the cube structure. Each pyramid 110, 112, 114, 116, 118, 120 of loops may be a SAS. Each pyramid 110, 112, 114, 116, 118, 120 of loops may include multiple layers of loops stacked in a pyramid structure. To make each individual pyramid, smaller and smaller pieces of PCB are stacked up to form the pyramid as will be described below in more detail with respect to FIGS. 2 and 3. The decreasing size of each additional layer provides the pyramid structure. Each layer in the stack forming the pyramid structure may include a series of loops.

As a result of the increased numbers of loops (coils), the sensitivity of multi-layer sensor 100 is greatly increased, as the multi-layer sensor 100 converts the magnetic field to an analog signal that electronic equipment can detect. Since the sensitivity of the multi-layer sensor 100 is proportional to the cross sectional area of the loops, the multi-layer structure maximizes the cross sectional area of the loops within the defined volume of the cube. The sensitivity of the sensor is a linear function of the surface area of loops created. Therefore, maximizing the area of the loops maximizes the sensitivity. The present sensor maximizes the loops and surface area of the loops in the defined volume to provide the maximum area possible. The design of the multi-layer sensor 100 provides approximately 10 times more sensitivity per defined volume as compared to existing sensor production methods. Further, by design, and in order to maintain a dynamic range of the system, each axis may be similar. By maintaining symmetry in each axis, the loops may provide the same sensitivity in each axis.

Figure 2:
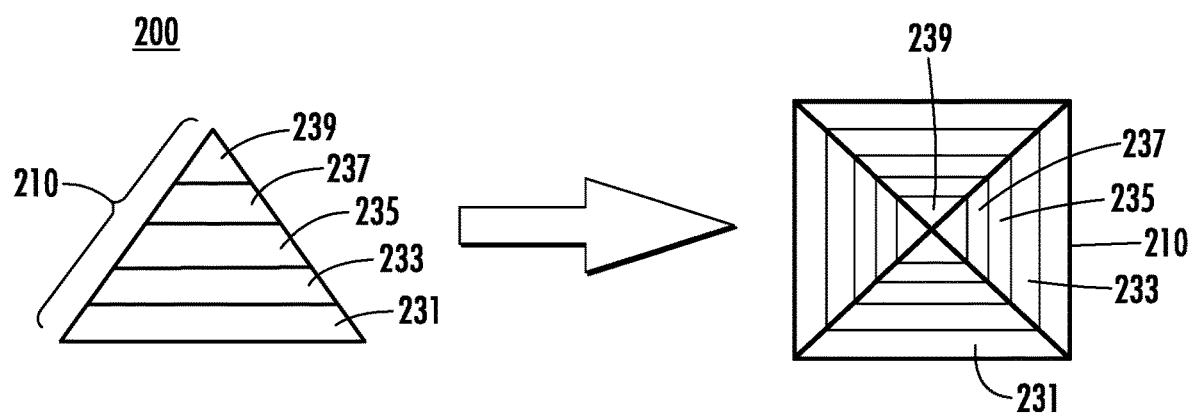
FIG. 2 depicts a pyramid sensor that may be used in forming the multi-layer sensor of FIG. 1.

FIG. 2 depicts a pyramid sensor 200 that may be used in forming the multi-layer sensor 100 of FIG. 1. Pyramid sensor 200 is a SAS. Pyramid sensor 200 may itself be considered a multi-layer sensor. Each layer may be made of PCB, and the layers may be interconnected, such as by placing one layer above the other and electrically coupling them together. To make pyramid 200, smaller and smaller pieces of PCB are stacked up to form pyramid 200.

By way of example, pyramid 200 may include a plurality of layers 210. Plurality of layers 210 may include any number of layers. For the sake of clarity and discussion, FIG. 2 includes a five-layer pyramid. However, any number of layers may be used, and the example of five layers is used for the clarity of discussion and understanding only. In such a five-layer configuration, plurality of layers 210 may include a base, or first layer 231, a second layer 233, and third layer 235, a fourth layer 237, and a top, or fifth layer 239. Base layer 231 may be the largest layer, as defined by area, and form the base of the pyramid. Second layer 233 may be the second largest layer and may be stacked upon base layer 231. Third layer 235 may be the third largest layer and may be stacked upon second layer 233. Fourth layer 237 may be sized smaller than third layer 235 and may be stacked upon third layer 235. Fifth layer 239 may be the smallest layer and may be stacked upon fourth layer 237.

While FIG. 2 depicts the fifth layer 239 at the point of pyramid 200, the fifth layer 239 may not be the point and pyramid 200 may not include a point, depending on the number of layers and size of the top layer. In fact, in the design, not including the layer forming the point may allow for combination of the pyramid sensor into the TAS forming a cube by providing some spacing for the six pyramids to be combined together.

By assembling six pyramids, allowing base layer 231 to form the side of a cube, a cube may be formed with each of the six pyramids 200 extending into the body of the cube as shown in FIG. 1. This extension toward the center of the cube may encroach the center of the cube, for example. That is, the top layer of each pyramid may be substantially in contact with each of the other top layers in the interior of the cube. Alternatively, the pyramid 200 may extend only partially into the center of the formed cube leaving a space in the center of the cube. This particular embodiment provides for high sensitivity which provides precise positional readings as discussed.

Figure 3A:
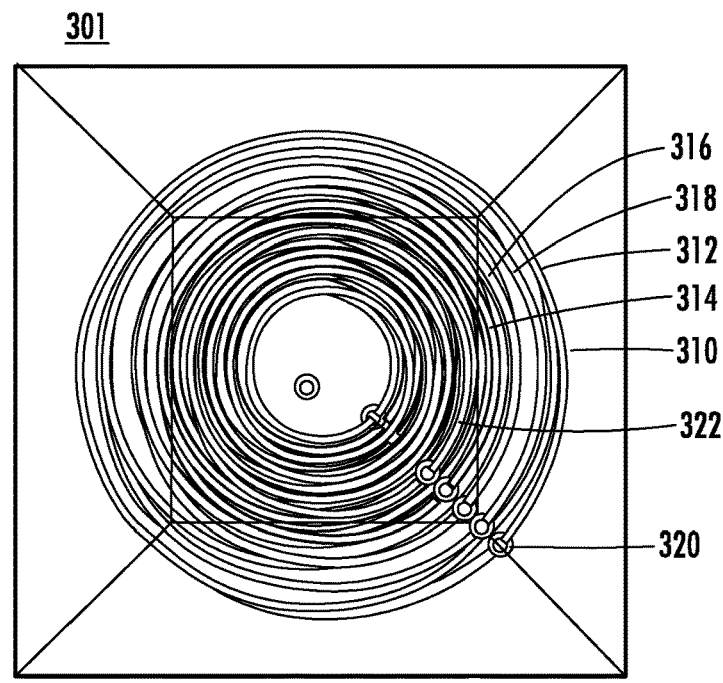
FIG. 3A-3C illustrate a pyramid structure providing additional detail of the sensor depicted in FIG. 2 including a top view of pyramid structure in FIG. 3A, an isometric view of pyramid structure in FIG. 3B, and a side view of pyramid structure in FIG. 3C.
Figure 3B:
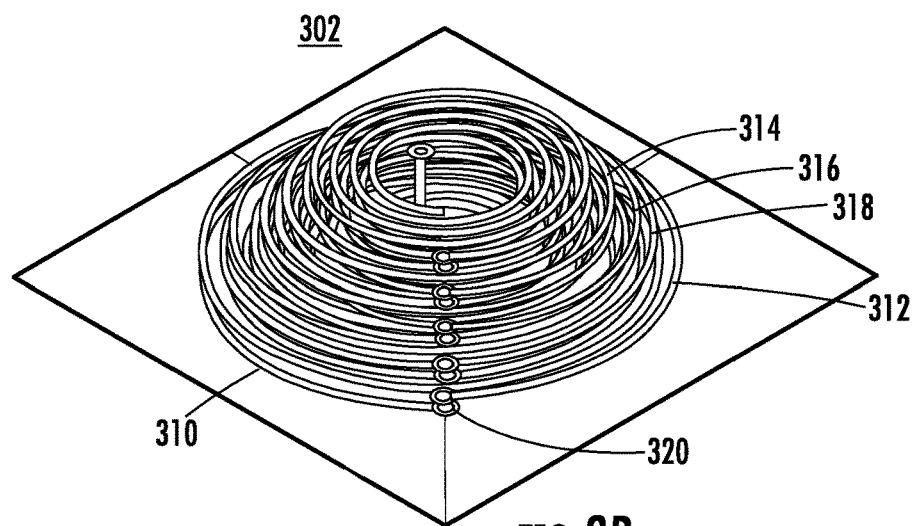
Figure 3C:
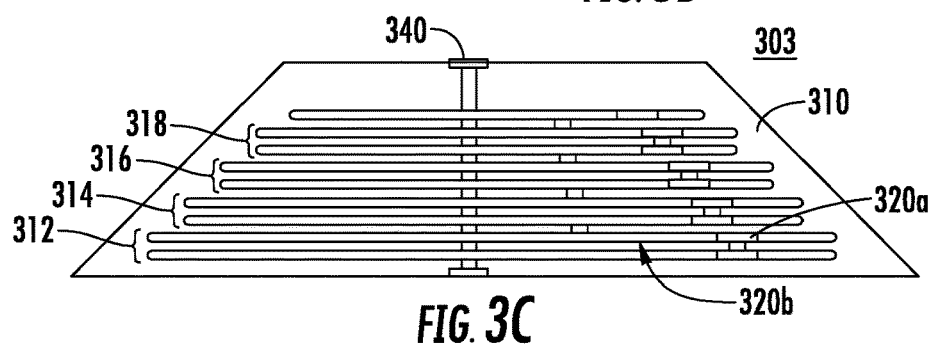

FIGS. 3A-3C illustrate a pyramid structure 300 providing additional detail from the pyramids depicted in FIGS. 1 and 2. FIG. 3A is a top view 301 of pyramid structure 300; FIG. 3B is an isometric view 302 of the pyramid structure 300; and FIG. 3C is a side view 303 of the pyramid structure 300. The depictions forming FIGS. 3A-3C illustrate the loops or coils while hiding the PCB and other structural materials from view.

Specifically referring to FIG. 3A, a depiction of the pyramid structure 300 and the PCB pyramid 310 from a top view 301 is pyramid. Pyramid structure 300 includes a PCB pyramid 310. The manufactured sensor includes eight layers when the external square size is 4.8 mm×4.8 mm the bigger layer contains 7 loops from diameter of 4.11 mm to 2.28 mm. The internal layer has 3 loops from diameter of 2.87 mm to 2.26 mm. Pyramid 310 includes a first layer 312, a second layer 314, a third layer 316, a fourth layer 318, and a fifth layer 322. As was described with respect to FIG. 2, first layer 312 may be the base of pyramid 310. Second layer 314 may be stacked upon first layer 312. Third layer 316 may be stacked upon second layer 314. Fourth layer 318 may be stacked upon third layer 316. Fifth layer 322 may be stacked upon fourth layer 318. While each layer 312, 314, 316, 318, 322 is described as having a single loop or coil, each layer 312, 314, 316, 318, 322 may instead include multiple windings per layer.

Each of the layers 312, 314, 316, 318, 322 is electrically connected to the respective layers 312, 314, 316, 318, 322 above and below using one of a series of interconnections 320. These interconnections 320 may include any type of method to electrically connect different layers, including solder points, wires, sockets, via traces or any other conventional connection methods. Interconnections 320 may also be used to electrically couple loops within a layer 312, 314, 316, 318, 322. While the present figure and description discuss interconnections 320 comprising solder points, other connecting elements may also be used instead of, or in addition to, solder connections. The electrical connections are then coupled to multi layers coil for use of the sensor.

Each of the layers 312, 314, 316, 318, 322 may be designed on a multi-layer PCB. As would be understood, multi-layer designs allow for higher loop density and therefore higher sensitivity. As is illustrated within FIG. 3A the pyramid structure 300 forms approximately a 4.8 mm square footprint, this is an example of design according to the need in Acclarent Navigation system.

FIG. 3B provides a depiction of the pyramid structure 300 and the PCB pyramid 310 from an isometric view 302. As described above, pyramid 310 includes a first double layer 312, a second double layer 314, a third double layer 316, and a fourth double layer 318. As was described with respect to FIG. 2, first layer 312 may be the base of pyramid 310. Second layer 314 may be stacked upon first layer 312. Third layer 316 may be stacked upon second layer 314. Fourth layer 318 may be stacked upon third layer 316. Each of the layers 312, 314, 316 is connected to the layers above and below and the loops within a layer may be interconnected using one of a series of solder points 320.

FIG. 3C illustrates a side view 303 of pyramid structure 300 and pyramid 310. As described above, pyramid 310 includes a first double layer 312, a second double layer 314, a third double layer 316, and a fourth double layer 318. As was described with respect to FIG. 2, first layer 312 may be the base of pyramid 310. Second layer 314 may be stacked upon first layer 312. Third layer 316 may be stacked upon second layer 314. Fourth layer 318 may be stacked upon third layer 316. In stacking layers 312, 314, 316, 318, each of the stacked up layers becomes smaller and smaller pieces of PCB to form pyramid 310. The decrease in size between the successive layers 312, 314, 316, 318 may form a continuous function. That is, each successive layer 312, 314, 316, 318 may decrease in size by approximately the same amount as the stack progresses. This angle of decrease is illustrated in FIG. 3C, such as being a 45° angle on the edges of pyramid 310. Such a design in the pyramid structure 300 allows for the proper configurations to be created when six of the pyramid structures are combined to form sensor 100 of FIG. 1, without interference between pyramids 310, and without having gaps (gaps represent areas of not capitalizing on using the available area to increase sensitivity) in between the pyramids 310 forming the sensor 100 of FIG. 1.

As shown in FIG. 3C, each layer 312, 314, 316, 318 may be formed by a complete loop or coil. The forming of the complete coil or loop is illustrated in the appearance that each layer 312, 314, 316, 318 is two rings. The manufactured sensor includes eight layers when the external square size is 4.8 mm×4.8 mm the bigger layer contains 7 loops from diameter of 4.11 mm to 2.28 mm. The internal layer has 3 loops from diameter of 2.87 mm to 2.26 mm.

Each of the layers 312, 314, 316, 318 is connected to the layers above and below. The loops within a layer may be interconnected using one of a series of interconnections 320b. The interconnection of multiple layers within a layer 312, 314, 316, 318 utilizes one of a series of interconnections 320a. Interconnections 320a and interconnections 320b may be one of any of the described interconnections 320. These are numbered separately to highlight the intra- and inter-layer connections, not by the mechanical type of connection made.

In addition, an alignment mechanism 340 may be utilized to form pyramid 310. This alignment mechanism 340 provides an electrical connection of the inner coil to the external surface. This may, in turn, be connected to wires or any other external connection. While specific geometries of the layers and connection points are illustrated in FIG. 3, any geometry may be utilized.

Figure 4:
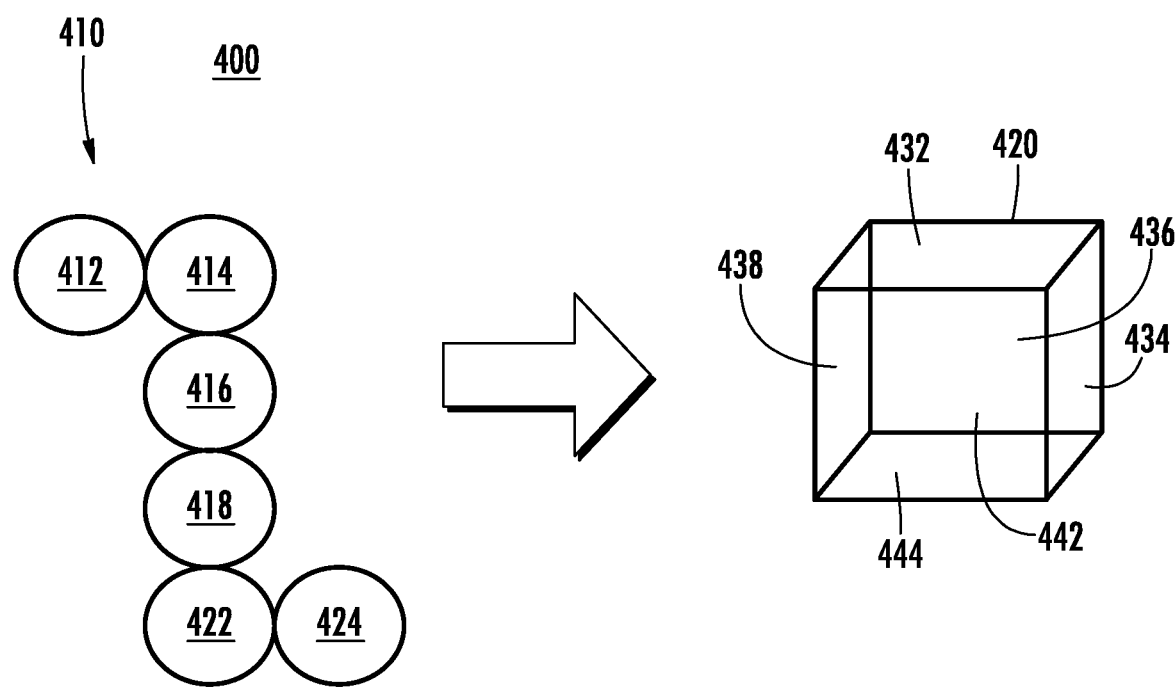
FIG. 4 depicts an additional design of a concentric sensor according to a second embodiment of the present invention.

FIG. 4 depicts an additional design of a concentric sensor 400 according to the present invention. Concentric sensor 400 includes six sensor circles, collectively referred to as sensor circles 410, folded into a cube 420. In forming concentric sensor 400, sensor circles 410 may include six sensor circles, including a first concentric circle 412, a second concentric circle 414, a third concentric circle 416, a fourth concentric circle 418, a fifth concentric circle 422, and a sixth concentric circle 424. In forming sensor circles 410, the first concentric circle 412 may be coupled to the second concentric circle 414, which, in turn, is coupled to the third concentric circle 416, which, in turn, is coupled to the fourth concentric circle 418, which, in turn, is coupled to the fifth concentric circle 422, which, in turn, is coupled to the sixth concentric circle 424. Sensor circle 410 may be formed from a single layer of PCB, for example. In certain embodiments, sensor circles 410 may be a single layer of PCB, and in other embodiments, sensor circles 410 may include multiple layers of circles in each circle. The additional layers may be configured as described above with respect to the pyramid embodiment, for example.

Geometrically, the second concentric circle 414, the third concentric circle 416, the fourth concentric circle 418, and the fifth concentric circle 422 may be configured in a linear configuration, as defined based on the approximate center of each circle 414, 416, 418, 422. Such a pattern of circles 414, 416, 418, 422 may provide the ability to form the circles 414, 416, 418, 422 from a single piece of PCB. The first concentric circle 412 may be formed at a right angle to the line formed from the center of circles 414, 416, 418, 422. The sixth concentric circle 424 may be formed at a right angle to the line formed from the center of circles 414, 416, 418, 422. The sixth concentric circle 424 may be configured at a right angle in a direction opposite to the first concentric circle 412. First concentric circle 412 and sixth concentric circle 424 may be formed at distal ends of the substantially linear circles 414, 416, 418, 422.

The configuration of sensor circles 410 as described above may enable the manipulation of sensor circles 410 into a cube 420. The intersection of each of two adjacent circles may provide a fold to form each circle as the side of a cube. By way of example, the first concentric circle 412 may be positioned, or form a first side 432 of cube 420, the second concentric circle 414 may be positioned, or form a second side 434 of cube 420, the third concentric circle 416 may be positioned, or form a third side 436 of cube 420, the fourth concentric circle 418 may be positioned, or form a fourth side 438 of cube 420, the fifth concentric circle 422 may be positioned, or form a fifth side 442 of cube 420, and the sixth concentric circle 424 may be positioned, or form a sixth side 444 of cube 420. Once assembled, sensor circles 410 form a cube 420 of sensor circles forming a concentric sensor.

Figure 5:
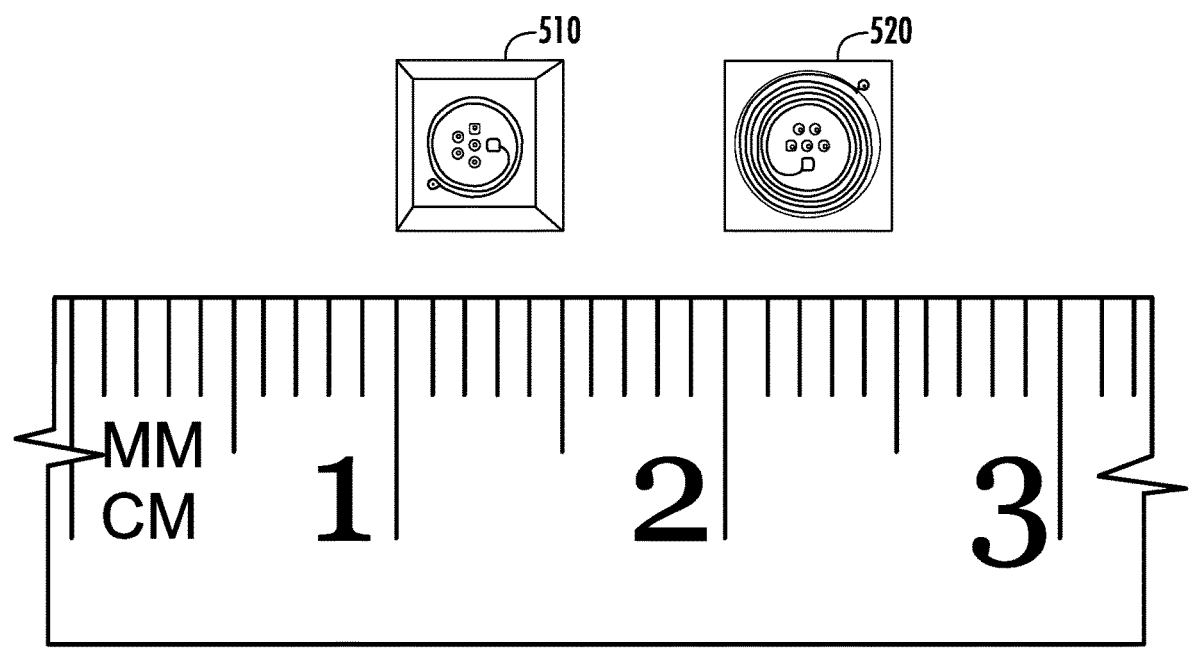
FIG. 5 illustrates the scale of the sensors in the present invention.

FIG. 5 illustrates one example of the scale of the sensors in the present invention. For example, a first sensor 510 as illustrated is approximately 5 mm square. As would be understood from the description above with respect to FIG. 1-3, a single side of the cube is depicted as sensor 510 in FIG. 5. That is, first sensor 510 is depicted showing only a single edge of the cube described in FIG. 1. A second sensor 520 as illustrated is also as 5 mm square. By way of example only, the sensors described herein provide sensitivities of approximately 4-5 mV/G, which corresponds to a sensitivity with gain of 20-25 V/G. Such configurations utilize a resistance of 3-4 ohms and provide a signal-to-noise (SNR) of approximately 40 dB. The provided sensitivities may be achieved using an 8-layer pyramid cube structure approximately 5 mm on a side.

Figure 6:
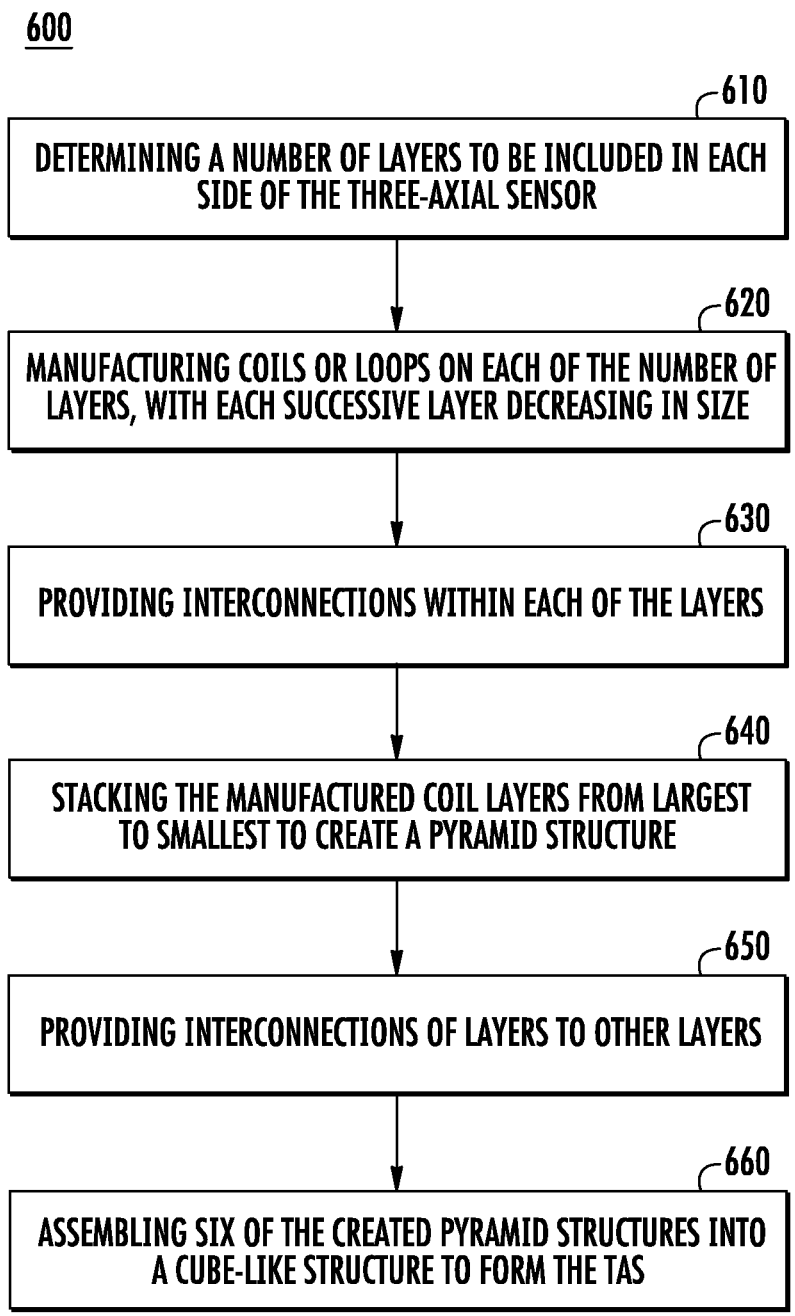
FIG. 6 illustrates a method of forming a three-axial sensor (TAS).

FIG. 6 illustrates a method 600 of forming a TAS. Method 600 includes determining a number of layers to be included in each SAS, or pyramid of the three-axial sensor at step 610. At step 620, method 600 includes manufacturing coils or loops on each of the number of layers, with each successive layer decreasing in size. Interconnections within each of the layers are provided at step 630. At step 640, each of the manufactured coil layers are stacked from largest to smallest to create a pyramid structure. Interconnections of layers to other layers are provided at step 650. At step 660, six of the created pyramid structures may be assembled into a cube-like structure to form the TAS.

Although features and elements are described above in particular combinations, one of ordinary skill in the art will appreciate that each feature or element can be used alone or in any combination with or without the other features and elements. In addition, the methods described herein may be implemented in a computer program, software, or firmware incorporated in a computer-readable medium for execution by a computer or processor.

What is claimed is:

1. A three-axial sensor (TAS) device, said device comprising:
    six single-axis sensors (SAS), each SAS including:
        a plurality of layers formed into a pyramid structure with each of the successive layers being configured to be smaller in area than the layer on which the successive layer is assembled;
        each of the plurality of layers including at least one coil substantially encompassing a cross sectional area of the layer on which the coil is formed; and
        a plurality of interconnections that interconnect each successive layer to the successive layer's adjacent layers, with the six SAS formed into a cube-like structure.

2. The device of claim 1 wherein the cube-like structure is approximately 5 mm per side.

3. The device of claim 1 wherein the sensitivity provided is approximately in the range of 4 to 5 mV/G.

4. The device of claim 1 wherein the TAS converts magnetic field to analog signal.

5. The device of claim 1 wherein the plurality of layers include 8-layers.

6. The device of claim 1 wherein each of the plurality of layers including at least one coil substantially encompassing a cross sectional area of the layer on which the coil is formed further comprises maximizing the number of loops in the coil within the at least one coil.

7. The device of claim 1 wherein the layers include a base formed from printed circuit board (PCB).

8. The device of claim 1 utilized in a cardiac mapping system.

9. The device of claim 1 utilized in an ear nose trot mapping system.

10. The device of claim 1 wherein the device is substantially symmetric, substantially concentric, and substantially homogenic.

11. The device of claim 1 wherein a biggest layer of the plurality of layers comprises 7 loops of a coil.

12. The device of claim 11 wherein the loops include a diameter from approximately 4.1 mm for the largest loop to approximately 2.3 mm for the smallest loop.

13. The device of claim 1 wherein a smallest layer of the plurality of layers comprises 3 loops of a coil.

14. The device of claim 13 wherein the loops include a diameter from approximately 2.9 mm for the largest loop to approximately 2.3 mm for the smallest loop.

15. A method of forming a three-axial sensor (TAS), said method comprising:
    determining a number of layers to be included in each single-axis sensor (SAS) as a pyramid of the three-axial sensor;
    manufacturing coils on each of the number of layers, with each successive layer decreasing in area footprint;
    interconnecting the coils within each of the layers;
    stacking the manufactured coils from largest to smallest to create a pyramid structure;
    interconnecting each successive layer to adjacent other layers of the number of layers; and
    assembling six of the created SAS into a cube-like structure to form the TAS.

16. The method of claim 15 wherein the number of layers comprises 8 layers.

17. The method of claim 15 wherein the layers include a base formed from printed circuit board (PCB).

18. The method of claim 15 wherein the sensitivity provided is approximately in the range of 4 to 5 mV/G.

19. The method of claim 15 wherein the TAS converts magnetic field to analog signal.

20. A single-axis sensor (SAS) device, said device comprising:
    a plurality of layers formed into a pyramid structure with each of the successive layers being configured to be smaller in area than the layer on which the successive layer is assembled, with each of the plurality of layers having formed thereon at least one coil, each of said at least one coil substantially encompassing a cross sectional area available within the layer that the coil is formed on; and
    a plurality of interconnections that interconnect each successive layer to the successive layer's adjacent other layers.

* * * * *

UNITED STATES PATENT AND TRADEMARK OFFICE
CERTIFICATE OF CORRECTION

PATENT NO. : 10,677,857 B2
APPLICATION NO. : 15/843837
DATED : June 9, 2020
INVENTOR(S) : Matityahu Amit et al.

It is certified that error appears in the above-identified patent and that said Letters Patent is hereby corrected as shown below:

On the Title Page
Item (57), under "ABSTRACT", in Column 2, Line 2, delete "three three-axial sensor (TAS)" and insert -- three-axial sensor (TAS) --, therefor.

In the Specification
In Column 1, Line 20, delete "improve" and insert -- to improve --, therefor.
In Column 2, Line 6, delete "FIG. 3A-3C" and insert -- FIGS. 3A-3C --, therefor.
In Column 2, Line 55, delete "three three-axial sensor (TAS)" and insert -- three-axial sensor (TAS) --, therefor.
In Column 7, Lines 4-5, delete "FIG. 1-3," and insert -- FIGS. 1-3, --, therefor.

Signed and Sealed this
Twenty-seventh Day of December, 2022

Katherine Kelly Vidal
*Director of the United States Patent and Trademark Office*